US010060966B2

(12) United States Patent
Menon et al.

(10) Patent No.: US 10,060,966 B2
(45) Date of Patent: Aug. 28, 2018

(54) METHOD AND APPARATUS FOR ENHANCING GUARDBANDS USING "IN-SITU" SILICON MEASUREMENTS

(71) Applicant: Intel Corporation, Santa Clara, CA (US)

(72) Inventors: Sankaran M. Menon, Austin, TX (US); Vasudev Bibikar, Austin, TX (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/667,365

(22) Filed: Mar. 24, 2015

(65) Prior Publication Data

US 2016/0285434 A1    Sep. 29, 2016

(51) Int. Cl.
| | |
|---|---|
| H01L 23/58 | (2006.01) |
| G01R 31/26 | (2014.01) |
| G06F 1/32 | (2006.01) |
| H01L 21/66 | (2006.01) |

(52) U.S. Cl.
CPC ....... *G01R 31/2637* (2013.01); *G06F 1/3203* (2013.01); *H01L 22/34* (2013.01); *H01L 23/58* (2013.01)

(58) Field of Classification Search
CPC ... G01R 31/2637; G06F 1/3203; H01L 22/34; H01L 23/58
USPC ...................................... 714/30–57, 699–824
See application file for complete search history.

(56) References Cited

U.S. PATENT DOCUMENTS

| | | | |
|---|---|---|---|
| 6,903,373 B1* | 6/2005 | Lotfi ................... | H01L 21/8258 257/347 |
| 7,397,259 B1* | 7/2008 | Agarwal ............ | G01R 31/3181 324/762.01 |
| 2003/0033976 A1* | 2/2003 | Coleman ................. | C30B 23/00 117/108 |
| 2006/0037941 A1* | 2/2006 | Weng .................. | G01N 21/9501 216/84 |
| 2006/0069974 A1* | 3/2006 | Herrmann ...... | G01R 31/318572 714/727 |
| 2007/0107160 A1* | 5/2007 | Jane Santamaria ..... | B60B 1/006 16/46 |
| 2007/0285080 A1* | 12/2007 | Abuhamdeh .... | G01R 31/31725 324/76.54 |
| 2009/0049220 A1* | 2/2009 | Conti ...................... | G06F 13/24 710/267 |
| 2009/0076751 A1* | 3/2009 | Li ....................... | G01R 13/0272 702/66 |
| 2009/0157936 A1* | 6/2009 | Goss .................... | G06F 1/3203 710/264 |
| 2011/0148456 A1* | 6/2011 | Mooyman-Beck ......................... | G01R 31/318511 324/762.02 |

(Continued)

*Primary Examiner* — Brandon S Cole
(74) *Attorney, Agent, or Firm* — Womble Bond Dickinson (US) LLP (57) ABSTRACT

A method and apparatus (e.g., semiconductor device) for setting voltages (e.g., guardbands) using "in situ," or on-die, silicon measurements are described. In one embodiment the semiconductor device comprises: a process monitor to measure silicon parameters of the semiconductor device; and a controller coupled to the process monitor to set a voltage for use on at least a portion of the semiconductor device based on silicon process monitor measurements.

20 Claims, 6 Drawing Sheets

(56) References Cited

U.S. PATENT DOCUMENTS

| | | | |
|---|---|---|---|
| 2014/0075171 A1* | 3/2014 | Karimian-Kakolaki | ............ G06F 1/26 713/2 |
| 2014/0244212 A1* | 8/2014 | Allen-Ware | ....... G01R 31/2851 702/182 |
| 2014/0260508 A1* | 9/2014 | Dar | ................ G01P 21/00 73/1.01 |
| 2016/0224716 A1* | 8/2016 | Farbiz | ............. G06F 17/5081 |

* cited by examiner

METHOD AND APPARATUS FOR ENHANCING GUARDBANDS USING "IN-SITU" SILICON MEASUREMENTS

FIELD OF THE INVENTION

Embodiments of the present invention relate to the field of process monitoring on a semiconductor device (e.g., an integrated circuit (IC), system-on-a-chip (SOC), etc.) to measure silicon parameters; more particularly, embodiments of the present invention relate to setting one or more voltages and/or the frequency for a semiconductor device based on silicon parameters measured on the semiconductor device.

BACKGROUND OF THE INVENTION

Currently, most of the Systems-on-a-Chip (SoCs) rely on $V_{min}$ (minimum voltage) searches by CMV (Component Marginality Validation) to define the lowest voltage at which the SoC can operate. In some cases, there are DVFS (Dynamic Voltage and Frequency Scaling) techniques that allow certain Intellectual Property cores (IPs) to operate at a higher frequency, using a higher voltage, based on work-load requirements. These higher voltages are also searched in silicon by CMV. To compensate for process variations and aging related reliability concerns, some guardband or margins are added to the above determined $V_{min}$ and $V_{max}$ searches.

Aging guardbands are needed mainly after a few months and/or years of operation. With current techniques, guardbands are imposed starting from the first day of product launch, with the product being run at a higher power target than it would have been set if more accurate information were used to set the guardbands, resulting in losing power in the crucial first few years of the product.

The existing technique for setting the guardband penalizes the performance of a semiconductor device because the device has to apply a higher voltage than necessary, resulting in additional power-dissipation. That is, the guardband that is applied is a higher voltage in order to obtain the expected performance over the life of the product. Applying a guardband which is a higher voltage on all the parts costs in terms of higher power dissipation consequently, thereby resulting in shorter battery life. This can also potentially result in a non-competitive product in the marketplace.

One fundamental disadvantage of the existing techniques for setting the guardband is that for pragmatic reasons, the measurements of a large number of parts are taken and used to determine the value to set as the wide guardband. This is inefficient in terms of power and performance. Furthermore, these mechanisms that are used to set the guardbands are currently costly in terms of time and effort and tend to excessively guardband to what is really needed.

There are many instantiations of process monitors in current day SoCs and integrated circuits (ICs) and are used primarily for characterization of silicon as well as for process monitoring purposes.

There are no clean mechanisms that exist to obtain an instantaneous feedback to accurately determine the voltage needed to compensate for process and aging related guardbands.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Overview

A semiconductor device (e.g., an integrated circuit (IC), system-on-a-chip (SOC), etc.) is disclosed having a process monitor to measure silicon parameters of the semiconductor device and a controller (e.g., a power management controller) coupled to the process monitor to set a voltage for use on at least a portion of the semiconductor device based on silicon process monitor measurements. In one embodiment, the voltage is a guardband voltage (e.g., an aging related guardband voltage).

In one embodiment, the semiconductor device described herein uses existing "in-situ" (on-die) process monitors to obtain instantaneous information on the process and/or performance (e.g., how fast silicon can perform) from each "die" individually to determine the voltage that is applied to that die. This occurs on each "die" separately, resulting in application of voltage based on performance of the individual "die" rather than the prior art methodology that uses a particular voltage determined by statistical methods (e.g., based on data collected from multiple "dies"), which is inefficient. In other words, efficient instantaneous feedback from the silicon die itself is used to set the voltage on each die individually, rather than using a statistically obtained voltage setting. By using the techniques described herein, a more optimal power dissipation can be achieved using the voltage set based on "in-situ" silicon process monitor measurements.

The techniques described herein enable per-device calibration without using testers to set a very narrow guardband specific to the device itself. In one embodiment, upon boot-up of device, process monitors on the device are checked to obtain the per-device measurements of silicon parameters to set the per-device guardband. This per-device measurement of silicon parameters not only helps to set a per-device guardband but also enables dynamic changes to be made to accommodate different functional behaviors (e.g., a large amount of graphics or hardware accelerator activities). That is, when the device has already booted up and is running, if there is demand from a functional unit (e.g., an IP, a core, graphics, an accelerator, etc.) for higher performance, then before setting of the DVFS voltage and frequency, the device checks the process monitor to see how fast the silicon can run and based on that, the technique described herein set the voltage and thus the frequency to get the higher performance, which is more efficient than not taking and using the process monitor measurements.

In one embodiment, the on-die process monitor comprises a process monitor chain and an agent (e.g., a firmware agent, a software agent, a hardware agent, etc.) to read data from the process monitor chain during a functional mode in which the device is operating. In one embodiment, the semiconductor device also has a JTAG Test Access Port (TAP) controller coupled to the process monitor chain to read data from the process monitor chain during test mode and selection logic (e.g., a multiplexor) coupled to the JTAG TAP controller to provide the JTAG TAP controller and the agent access to the process monitor chain at different times based on the mode in which the device is.

Figure 1:
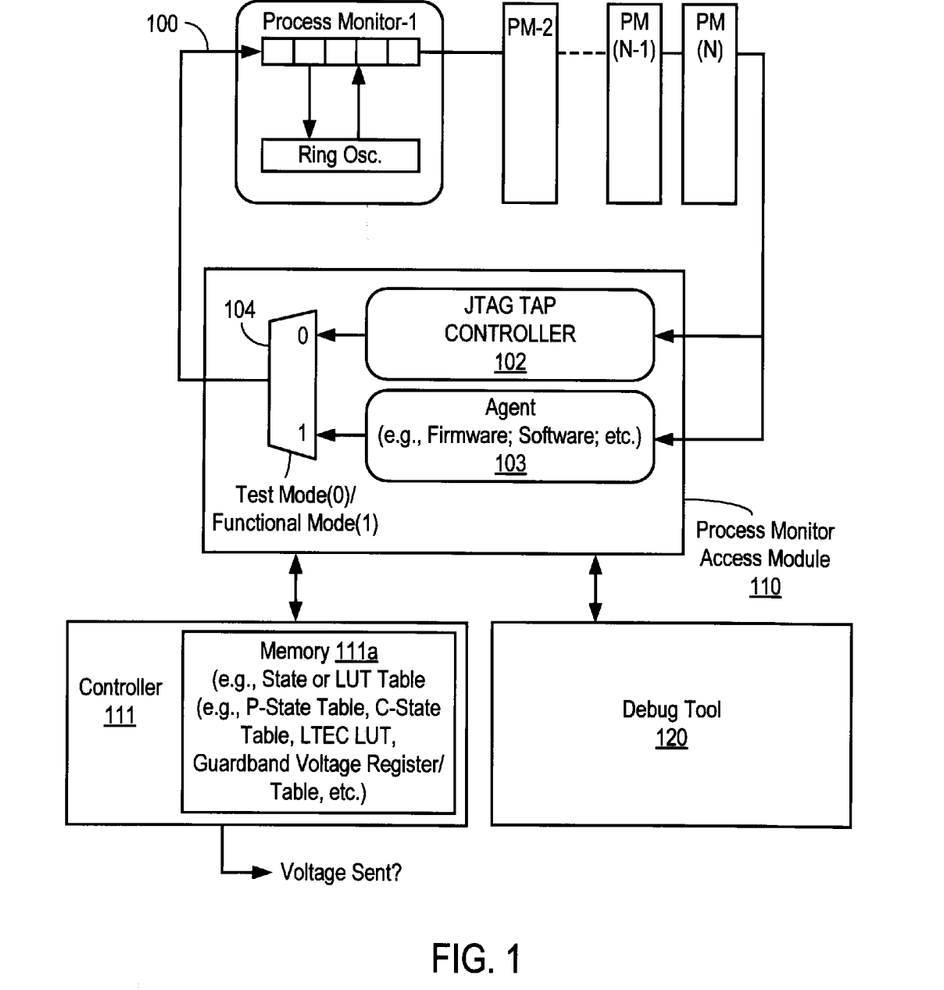
FIG. 1 is a block diagram of a process monitor chain in a semiconductor device or die (e.g., IC, SoC, etc.)

FIG. 1 is a block diagram of a process monitor chain in a semiconductor device, or die (e.g., IC, SoC, etc.). Referring to FIG. 1, process monitors 1-N form a process monitor chain 100. In one embodiment, access to process monitor chain 100 is through process monitor access module 110. In one embodiment, process monitor access module 110 includes a JTAG TAP controller 102 that accesses process monitor chain during test mode using IEEE1149.1 JTAG in a manner well-known in the art. Test equipment, like external debug tool 120, sends JTAG commands to address each of process monitors 1-N (and their corresponding ring oscillators) in one of the many locations (about 100 to 180 or more process monitors in one embodiment of the die). More specifically, in one embodiment, the JTAG access is used to address each of the process monitors using TDI (Test Data Input) and the TDO (Test Data Output) is used to read the count value provided by a process monitor in a manner well-known in the art.

In one embodiment, process monitor access module 110 also includes an agent 103 that reads one or more of the process monitors in chain 100 and feeds the various information received from the process monitors such as, for example, process information, temperature information, leakage information, frequency maximum for the device, voltage thresholds of n-channel and p-channel transistors, whether a particular portion of the silicon is dominated by n-channel or p-channel transistors, etc. into a controller 111 (e.g., power-management logic or controller) as feedback. The reading of the process monitors by agent 103 occurs when the semiconductor device is operating or functional (not under test). In one embodiment, agent 103 is a firmware agent. In another embodiment, agent 103 is a software agent. In yet another embodiment, agent 103 is a hardware agent.

In one embodiment, controller 111 sends a request to agent 103 to have agent 103 provide the various information from one or more of the process monitors in process monitor chain 101 as feedback. Such information is stored in a memory, such as memory 111a, in controller 111 or in a memory external to controller 111, but typically on the same semiconductor device. The information may be stored in a table (e.g., state table, P-state table, C-state table, lookup (LUT) table, etc.) or register.

Process monitor access module 110 includes a selection mechanism 104 to enable process monitor chain 101 via JTAG TAP controller 102 or agent 103. During test mode, process monitor chain 101 is enabled via JTAG TAP controller 102, while during functional mode, process monitor chain 101 is enabled via agent 103. In one embodiment, selection mechanism 104 is a multiplexor that has a selection input to select the mode (e.g., 0 for test mode and 1 for functional mode).

During either functional mode or test mode, a process monitor count value based on the ring oscillator frequency from a process monitor is collected. The count value of each of the ring oscillators can be mapped to a process and/or temperature corner or any other information gathered from the process monitor of the die. In one embodiment, the process monitors are placed at a particular pitch based on the process node. In one embodiment, the pitch is 1 mm or less depending on the process node and the number of process monitors consists of between 20 and 32 or more ring oscillators each tuned to provide various information such as, for example, process information (e.g., process corner information (e.g., fast, slow, etc.), temperature information, leakage information, transistor threshold voltage, etc. in a manner well-known in the art.

In one embodiment, controller 111 converts the ring oscillator frequency that runs at a very high frequency to a lower frequency using a divider network, which is then read out. Controller 111 then sends the count value of the voltage, which corresponds to a particular voltage, to the DVFS logic, guardband logic etc., to set the voltage for a particular die. In one embodiment, agent 103 gives access to the process monitors to obtain instantaneous feedback to one or more of the following features of the semiconductor device: DVFS (Dynamic Voltage and Frequency Scaling); reducing the aging related guardband; and LTEC (Low Temperature Effect Compensation). Accommodating dynamic changes in this manner provides considerable benefits for guardband reduction, dynamic voltage and frequency scaling (DVFS), and Low Temperature Effect Compensation (LTEC) performance efficiency.

With respect to DVFS, in one embodiment, the voltage and frequency steps (or at least one or more of the steps thereof) used in DVFS to control the power used by functional blocks in the semiconductor device, such as, for example, the CPU cores, uncore multi-media core blocks, etc., are based on instantaneous feedback from in-situ (on-die) silicon measurements instead of theoretical calculations as in the prior art. For example, if the feedback determines that the device is able to handle a higher frequency than other devices of the same type (e.g., the die runs fast), then a guardband that dictates a voltage higher for a particular frequency does not have to be used and instead can be replaced with a lower voltage for that frequency. In other words, the DVFS logic is able to apply a lower voltage than what would be determined using the prior art statistical techniques. In one embodiment, information feedback from the process monitors that is useful for DVFS is the process and temperature information. More specifically, this process and temperature information is used to decide on a voltage, which in turn allows the frequency setting to be applied. Since this voltage is based on an in-situ measurement for that particular die, this value will be lower than the statistical value that is set based on many sample dies (or dice). This results in a lower power usage in comparison to the conventional statistical method of setting and applying such a voltage.

With respect to LTEC, in one embodiment, the instantaneous in-situ process monitor information is used to enhance a table (e.g., a lookup table (LUT)) that is created as part of the silicon characterization done for LTEC. In other words, the "in-situ" process monitor measurements are used by a controller (e.g., the power management controller) for determining the LTEC voltage requirements rather than using the look-up table set by statistical methods that is currently used in the prior art. This saves several hours and/or days that is currently used for characterization purposes.

With respect to aging guardbands in which additional $V_{min}$ guardbands are applied from the beginning of life of the product to compensate for reliability as well as aging related effects of silicon, which due to its early use effects power/performance, the instantaneous in-situ process monitor information is used to identify a voltage in place of the voltage determined via prior art guardbanding generation. In one embodiment, this voltage is determined by measuring the process monitor values for that processing block or the die, which is used to set the voltage, and in turn, to set the frequency divide ratios to set the frequency of the device.

Figure 2:
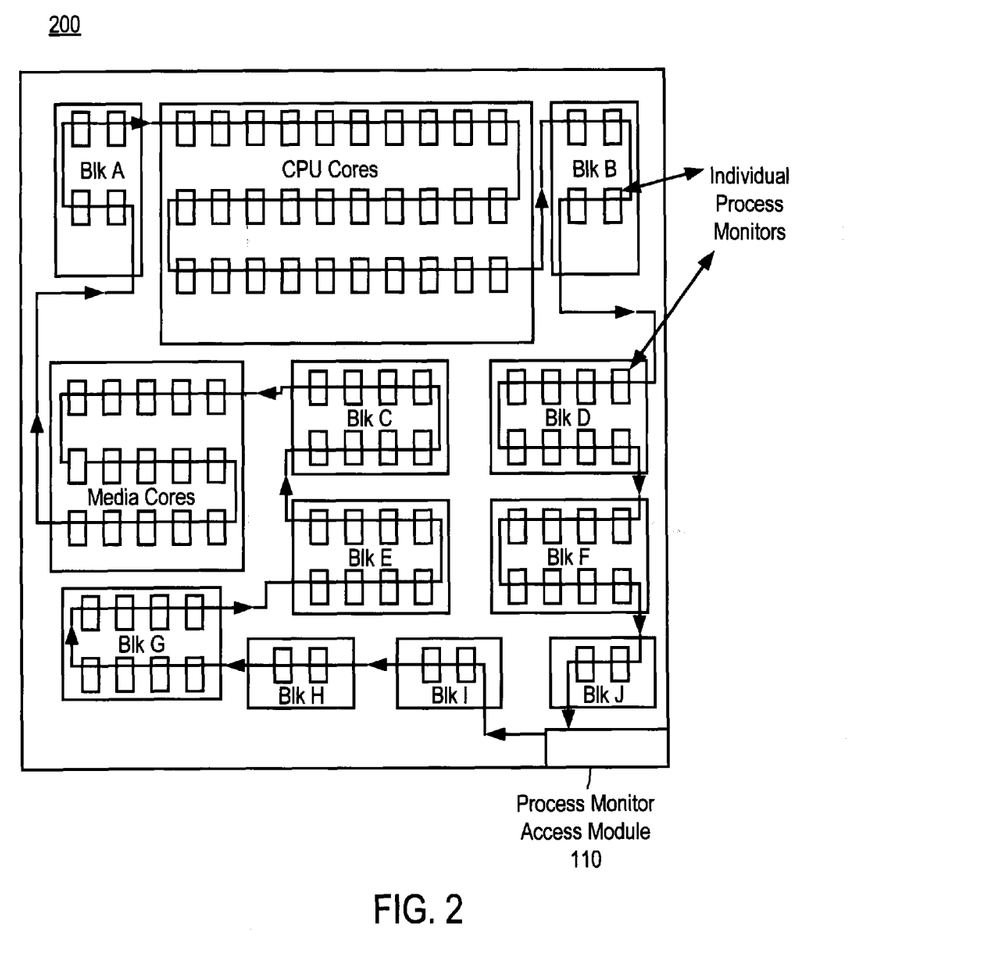
FIG. 2 is a block diagram of one embodiment of a semiconductor device.

In one embodiment, the process monitors are typically placed at regular intervals and are strung together as a chain. FIG. 2 is a block diagram of one embodiment of a semiconductor device. Referring to FIG. 2, semiconductor device 200 includes a number of processing and/or logic blocks labeled A-J and blocks labeled "media core" and "CPU cores". Each of these blocks include multiple individual process monitors that are coupled together within the respective block to form a process monitor chain in the block. In one embodiment, the process monitors are placed uniformly throughout the blocks and semiconductor device 200 in order to obtain the processor and other monitored information. The beginning of each process monitor chain of individual blocks is coupled to the end of a process monitor chain of another block, while the end of each processor monitor chain in a block is coupled to the beginning of a process monitor chain in another block, with the exception blocks I and blocks J. In that case of blocks I, the beginning of its process monitor chain is coupled to the output of the process monitor access module 201, and in the case of block J, the end of its process monitor chain is coupled to process monitor access module 201. Thus, the individual process monitor chain of the individual blocks are coupled together to form a chain enabled by process monitor access module 110.

In one embodiment, measurement to obtain the information from the process monitors is initiated by accessing a n-bit register in each of the process monitors, where n is more than one bit (e.g., 5, 6, 7, 8 bits, etc.). In one embodiment, the selection of n depends on how many process parameters are required. For example, if there are 100 process monitors in an example SoC and or equals 5, it would take about 100*5 (equals 500) cycles to initialize the process monitor chain. Note that in one embodiment only one process monitor is enabled at one time by shifting in a non-zero value, while the remaining are shifted with "all-zeroes," resulting in the remaining process monitors not being interrogated. In one embodiment, the one particular process monitor that is interrogated selects the oscillator based on the non-zero value that it gets and the oscillator that provides the frequency information runs at approximately 10 GHz to 20 GHz (or higher) or so. Faster silicon runs at higher frequencies while slower silicon runs are slower frequency. This high frequency is divided by 32 or 64 to obtain a frequency below about 500 MHz, or at a rate that the system can handle, and is transmitted via the same process monitor chain to a counter in process monitor access module 201, which provides the count value equivalent to the frequency that was sent by the process monitor.

Referring back to FIG. 1, during manufacturing testing, JTAG TAP (Test Access Port) of process monitor access module 110 is used to access the process monitors, but during functional mode, the agent of process monitor access module 110 (e.g., FW agent, SW agent, etc.) read the process monitors. In one embodiment, the process monitors are accessed serially by agent of process monitor access module 110 with a faster mechanism implemented for reading the process monitor readings. In one embodiment, the process monitor chain run sat about 100 MHz, which is about 10 ns per clock cycle.

One embodiment of a process for taking a measurement from a process monitor comprises the following. To measure the 100$^{th}$ process monitor, which is the worst-case, in this example, it takes 100*5=500 cycles, which is 500*10 ns=5 µs. It takes one clock cycle to do the reading which is a n eligible amount of time of 10 ns, compared to the shift time of 5 µs. The oscillator in the process monitor starts running and this value (from the oscillator) is divided by 32/64 to get a frequency of less than 500 MHz, or at a rate the system can handle, which is then sent to the counter in the process monitor. A pause time of 2 µs is applied for capturing the process monitor values. The total time taken is 5 µs (for shift)+10 ns (for updating the values)+2 us (pause time)+10 ns (for updating the frequency) and then a maximum of 5 µs for shifting the values to the counter, thereby resulting in a total of about 12 µs. The process monitor value pertaining to the frequency at which the silicon is running at that spot on the die is obtained in 12 µs. In one embodiment, depending on the size of the block, either 1, 2, 4 or more process monitors need to be monitored and averaged to get a more accurate value. The use of averaging occurs in situations where the silicon area is larger, such as, for example, when dealing with a CPU or multi-media core, and has multiple process monitors. In such a case, the values of all or a subset of process monitors are collected and averaged. Then, the averaged value(s) is used to set voltage.

The average value obtained is used to set the voltage and frequency of operation for DVFS, instead of the "guardband" values that are used currently. This same concept can be applied to set the LTEC limits in addition to in-situ measurement of die temperature that is currently used for an even more accurate LTEC setting. This provides a more instantaneous value from silicon to apply a voltage as well as frequency rather than using a fixed value of voltage after manufacturing.

Note that in one embodiment, the power management controller can use a combination of information from the process monitors and other sources. For example, in one embodiment, the process management controller requests information from the process monitors to obtain some information, such as, for example, the process information, but receives other information, such as the temperature information, for other sources (e.g., temperature sensors on the device).

DVFS

In one embodiment, the controller is a power management controller sets one or more voltages for use in one or more steps of dynamic voltage and frequency scaling (DVFS) performed on the device based on based on silicon process monitor measurements. In such as case, in one embodiment, the silicon parameters comprise temperature and process information. In one embodiment, in this context, the process information comprises how fast or slow the silicon can perform or run With respect to DVFS, in order to enable a power management unit or controller to read the process and temperature "in-situ" information from the process monitors (e.g., ring-oscillators), the access to the process monitors is made by an agent (e.g., firmware (FW) controller, software (SW) control, etc.) so that the power management controller can access this information for making the DVFS updates.

Figure 4:
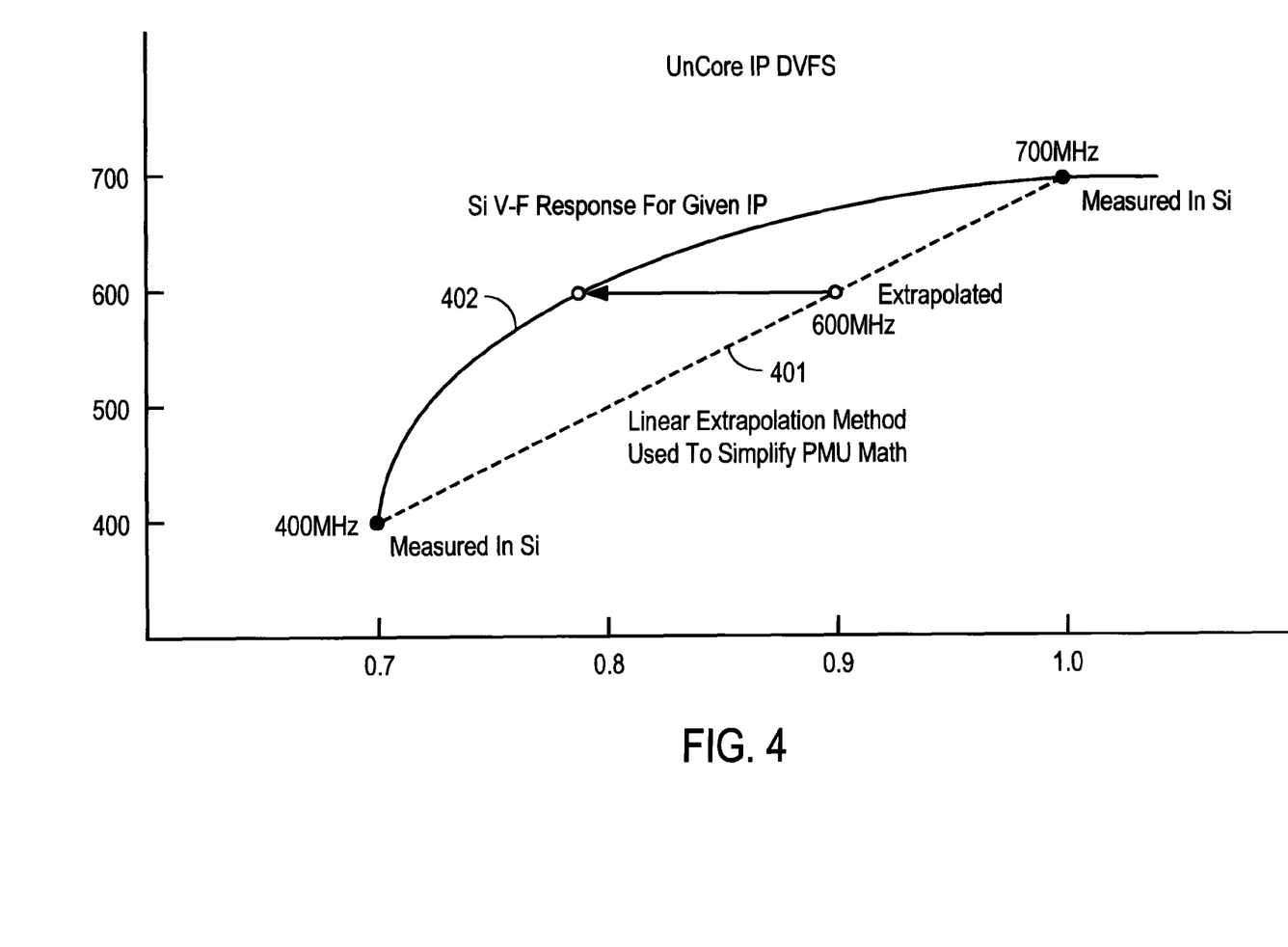
FIG. 4 illustrates a graph depicting an example of differences in voltages determined based on silicon characterization and interpolation.

For example, consider core current DVFS mechanism for a critical uncore IP block that supports 400, 600 and 700 MHz operation at different operating voltages. Considering a hypothetical case, where the voltages corresponding to the frequency of operation at 400 MHz and 700 MHz are measured during silicon characterization. However, the voltage related to 600 MHz operation is extrapolated by the process management controller. In order to keep the mathematical analysis simple, this extrapolation is done via a simple linear extrapolation method shown as dashed blue line 401 in FIG. 4. Now, if one considers the real silicon response as shown by solid curve 402, the same 600 MHz operation could have been achieved at a lower voltage, which results in saving of power (~0.79V vs. 0.9V). Thus, during operation, the power management controller, via the agent in process monitor access module, obtains data that indicates that it could set the voltage to the lower value.

Figure 5:
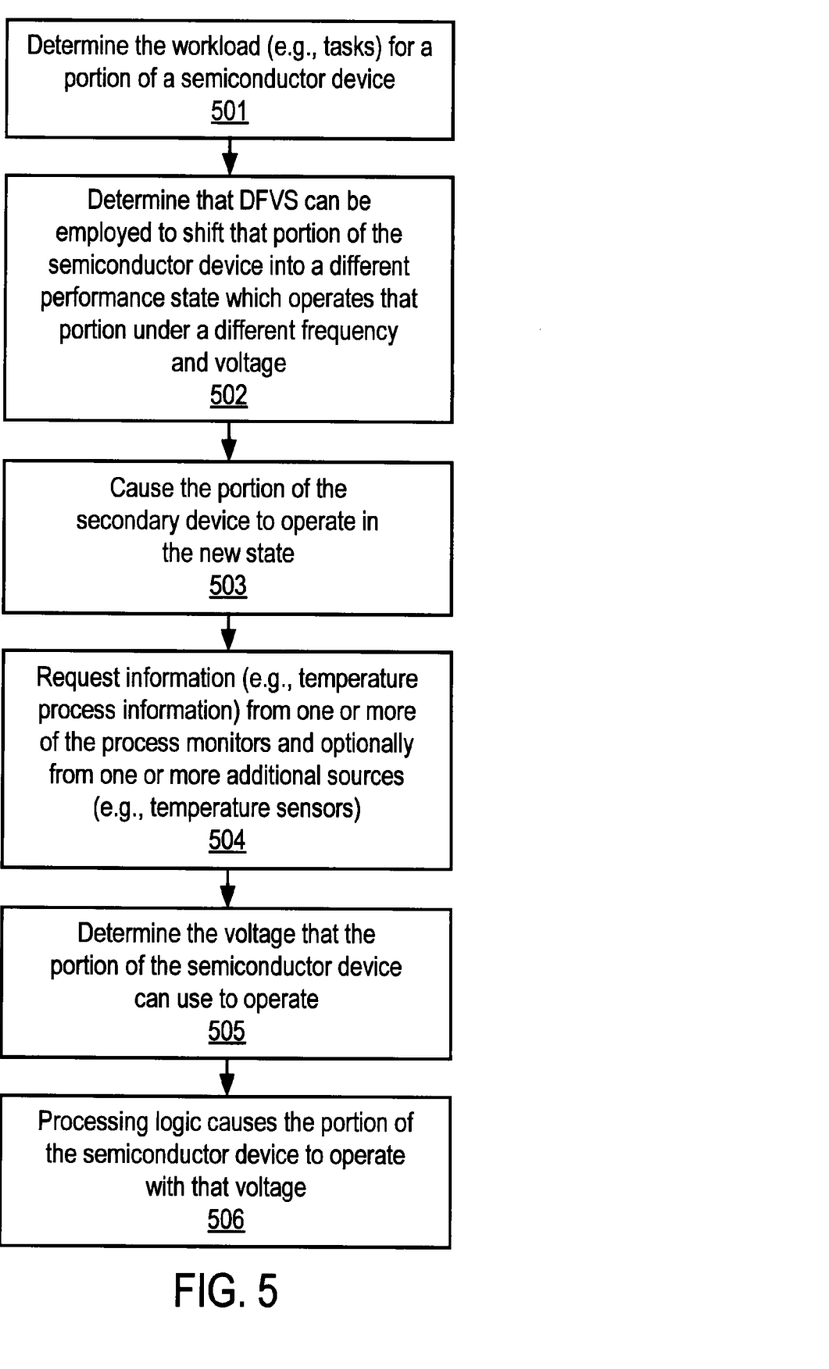
FIG. 5 illustrates a flow diagram of one embodiment of a process for controlling power usage of a semiconductor device.

FIG. 5 illustrates a flow diagram of one embodiment of a process for controlling power usage of a semiconductor device. The process is performed by processing logic that may comprise hardware (circuitry, dedicated logic, etc.), software (such as is run on a general purpose computer system or a dedicated machine), or a combination of both. Referring to FIG. 5, the process begins by processing logic determining the workload (e.g., tasks) for a portion of a semiconductor device (processing block 501). This occurs in a manner well-known in the art. In one embodiment, the workload may comprise one or more tasks performed by a portion (e.g., a CPU core, multi-media core, other functional block and a processor or SoC, etc.).

Based on the increased workload, processing logic determines that DFVS can be employed to shift that portion of the semiconductor device into a different performance state which operates that portion under a different frequency and voltage (processing block 502). For example, this may be a different P-state for a processor.

In response to determining that the portion of the semiconductor device can operate in a different performance state, processing logic causes the portion of the secondary device to operate in the new state (processing block 503). In one embodiment, this may be optional in that this operation may be performed before obtaining data from the process monitors. In one embodiment, a processing logic causes the portion of the semiconductor device to operate in the new state by signaling a voltage regulator to provide the voltage of the new performance state to be used in the new state and signal a clock generator (e.g., PLL) to provide clocking at the frequency and used in the new state.

In response to determining that DVFS are to be used, processing logic requests information (e.g., temperature process information) from one or more of the process monitors and optionally from one or more additional sources (e.g., temperature sensors) (processing block 504).

Using the requested information, processing logic determines the voltage that the portion of the semiconductor device can use to operate (processing block 505). Thereafter, processing logic causes the portion of the semiconductor device to operate with that voltage (processing block 506). In one embodiment, processing logic causes the portion of the semiconductor device to operate under the new voltage by signaling a voltage regulator to provide that specific voltage to the portion of the semiconductor device to operate.

In one embodiment, the controller is a power management controller that sets a voltage for Low Temperature Effect Compensation (LTEC) based on silicon process monitor measurements. In one embodiment, the power management controller is operable to update a table with information indicative of the voltage.

Figure 3:
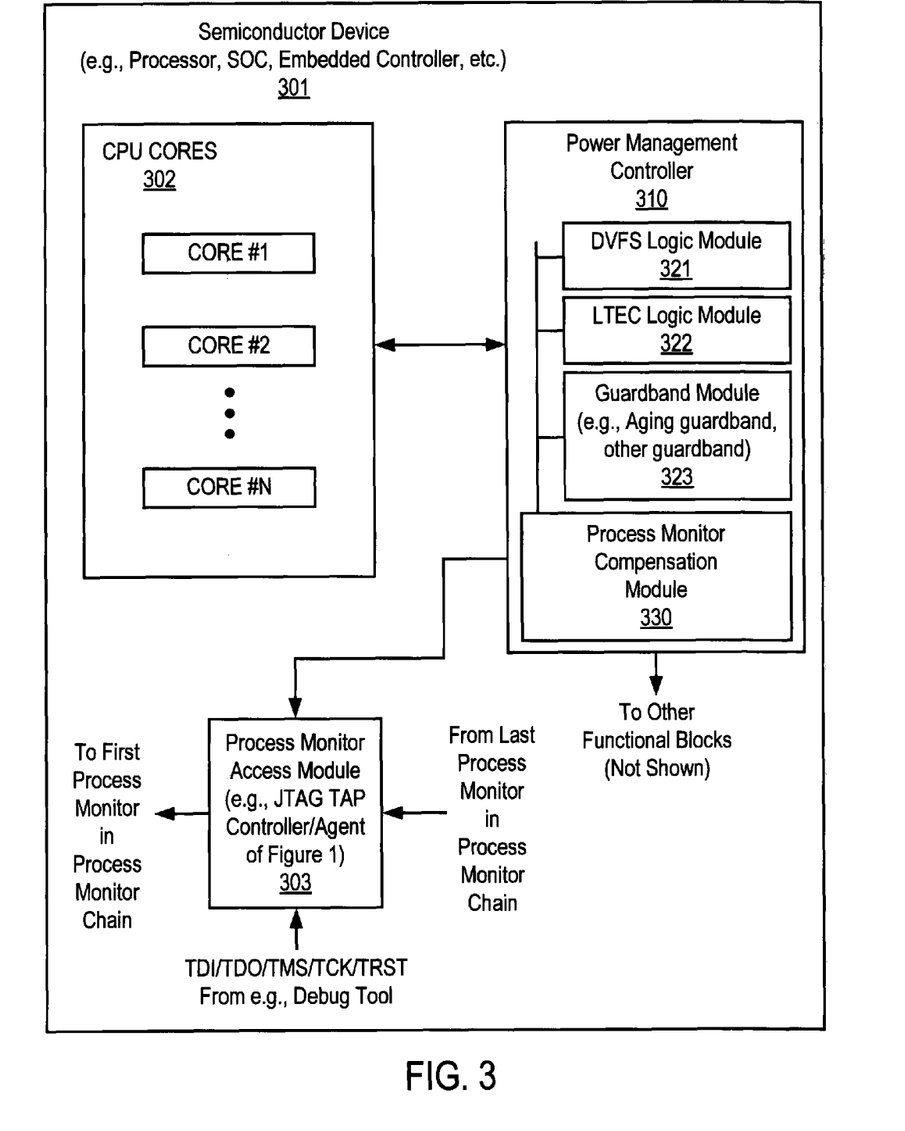
FIG. 3 illustrates one embodiment of a semiconductor device.

Note that the process for compensating for the Low Temperature Effects is very similar to that of FIG. 5, except instead of a lookup table, the process monitor measurements are used to set the correct voltage for compensating for the Low Temperature Effects FIG. 3 illustrates one embodiment of a semiconductor device. Referring to FIG. 3, semiconductor device (e.g., processor, SOC, embedded controller, etc.) includes a number of functional blocks such as, for example, CPU cores 302 that includes cores 1-N. Semiconductor device also includes process monitor access module 303 which enables access to the processor monitor chain of process monitors throughout various functional blocks in semiconductor device 301. Semiconductor device also includes power management controller 310 that controls power management for semiconductor device 301. Power management controller 310 communicates with CPU cores 302 and other functional blocks as well as process monitor access module 303.

Power management controller 310 includes a process monitor compensation module 330 that sends requests to process monitor access module 303 to obtain instantaneous data regarding process, temperature and other feedback from the process monitors in the process monitor chain of semiconductor device 301. The information fed back from process monitor access module 303 is used by process monitor compensation module 330 to set voltages for one or more of DVFS logic module 321, LTEC logic module 322 and guardband module 323 as discussed above.

More specifically, in one embodiment, the process monitor information pertaining to the query sent by power management controller 310 is returned back to power management controller 310 with the instantaneous reading from the process monitor. The "in-situ" process monitor information is used to update the voltage and frequency information used by DVFS that resulted in inefficient DVFS operation. The process monitor information also results in achieving efficient LTEC settings, as well as improved "guardband", thus not penalizing the power and performance of the parts during the entire life-span of the product life-cycle.

In one embodiment, the power management controller includes the logic to generate the updated voltage. In another embodiment, the data is updated by the access control module or the process monitor itself.

In one embodiment, the process monitor access module or other logic generates interrupts to the functional blocks of the die to stop their operation in order to get the instantaneous values when reading the process monitors. In another embodiment, the process monitor access module does not need to interrupt functional units and is able to merely poll the process monitors for the needed data.

Thus, the "in-situ" process monitor measurements in conjunction with the use of the technique described herein results in reduced power drawn by the device, thus improving DVFS performance, achieving reduced guardbands and improving LTEC performance, which ultimately improves the power and performance of semiconductor devices.

Figure 6:
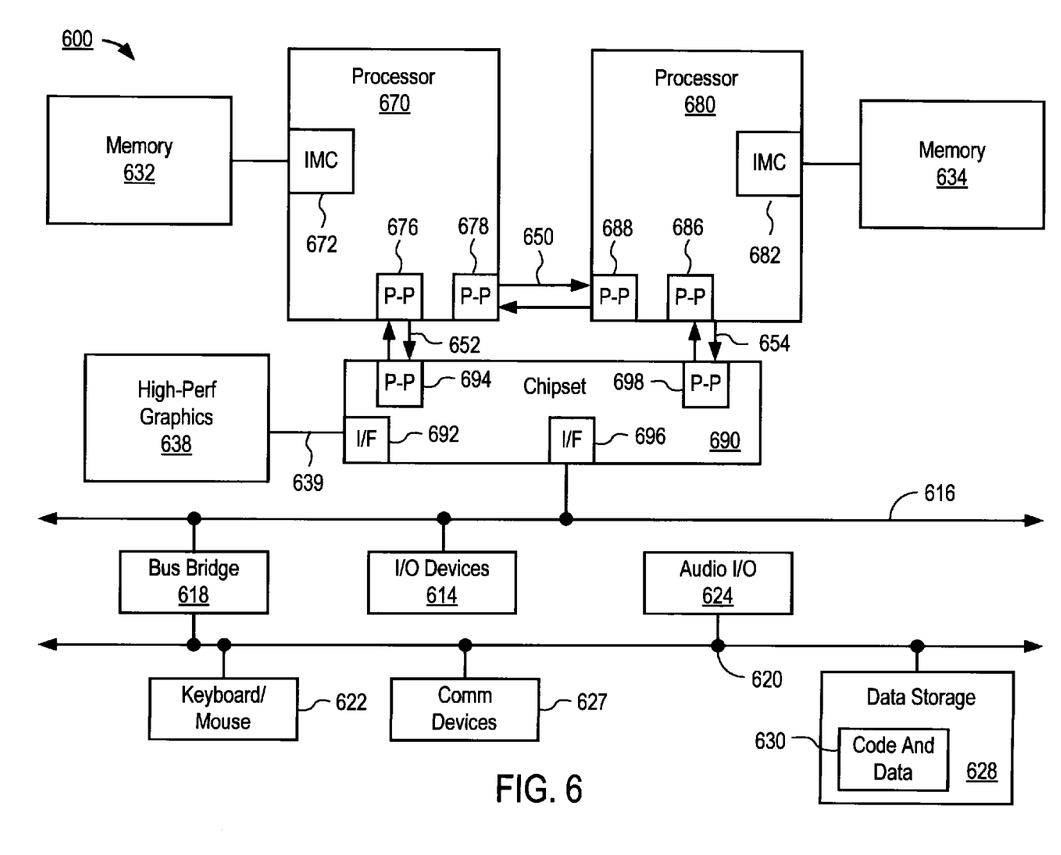
FIG. 6 illustrates one embodiment of a block diagram for a computing system.

Referring now to FIG. 6, shown is a block diagram of a system 600 in accordance with an embodiment of the present invention. As shown in FIG. 6, multiprocessor system 600 is a point-to-point interconnect system, and includes a first processor 670 and a second processor 680 coupled via a point-to-point interconnect 650. Each of processors 670 and 680 may be some version of a processor. In one embodiment, 652 and 654 are part of a serial, point-to-point coherent interconnect fabric, such as Intel's Quick Path Interconnect (QPI) architecture. As a result, the invention may be implemented within the QPI architecture.

While shown with only two processors 670, 680, it is to be understood that the scope of the present invention is not so limited. In other embodiments, one or more additional processors may be present in a given processor.

Processors 670 and 680 are shown including integrated memory controller units 672 and 682, respectively. Processor 670 also includes as part of its bus controller units point-to-point (P-P) interfaces 676 and 678; similarly, second processor 680 includes P-P interfaces 686 and 688. Processors 670, 680 may exchange information via a point-to-point (P-P) interface 650 using P-P interface circuits 678, 688. As shown in FIG. 6, IMCs 672 and 682 couple the processors to respective memories, namely a memory 632 and a memory 634, which may be portions of main memory locally attached to the respective processors.

Processors 670, 680 each exchange information with a chipset 690 via individual P-P interfaces 652, 654 using point to point interface circuits 676, 694, 686, 698. Chipset 690 also exchanges information with a high-performance graphics circuit 638 via an interface circuit 692 along a high-performance graphics interconnect 639.

A shared cache (not shown) may be included in either processor or outside of both processors; yet connected with the processors via P-P interconnect, such that either or both processors' local cache information may be stored in the shared cache if a processor is placed into a low power mode.

Chipset 690 may be coupled to a first bus 616 via an interface 696. In one embodiment, first bus 616 may be a Peripheral Component Interconnect (PCI) bus, or a bus such as a PCI Express bus or another third generation I/O interconnect bus, although the scope of the present invention is not so limited.

As shown in FIG. 6, various I/O devices 614 are coupled to first bus 616, along with a bus bridge 618 which couples first bus 616 to a second bus 620. In one embodiment, second bus 620 includes a low pin count (LPC) bus. Various devices are coupled to second bus 620 including, for example, a keyboard and/or mouse 622, communication devices 627 and a storage unit 628 such as a disk drive or other mass storage device which often includes instructions/code and data 630, in one embodiment. Further, an audio I/O 624 is shown coupled to second bus 620. Note that other architectures are possible, where the included components and interconnect architectures vary. For example, instead of the point-to-point architecture of FIG. 6, a system may implement a multi-drop bus or other such architecture.

In a first example embodiment, a semiconductor device comprises: a process monitor to measure silicon parameters of the semiconductor device; and a controller coupled to the process monitor to set a voltage for use on at least a portion of the semiconductor device based on silicon process monitor measurements.

In another example embodiment, the subject matter of the first example embodiment can optionally include that the process monitor comprises a process monitor chain and an agent to read data from the process monitor chain.

In another example embodiment, the subject matter of the first example embodiment can optionally include that the semiconductor device further comprises a JTAG TAP controller coupled to the process monitor chain to read data from the process monitor chain and selection logic coupled to the JTAG TAP controller to provide the JTAG TAP controller and the agent access to the process monitor chain.

In another example embodiment, the subject matter of this example embodiment can optionally include that the selection logic comprises a multiplexor.

In another example embodiment, the subject matter of the first example embodiment can optionally include that the voltage is a guardband voltage. In another example embodiment, the subject matter of this example embodiment can optionally include that the guardband is an aging related guardband voltage.

In another example embodiment, the subject matter of the first example embodiment can optionally include that the controller is a power management controller to set one or more voltages for use in one or more steps of dynamic voltage and frequency scaling (DVFS) performed on the device based on based on silicon process monitor measurements. In another example embodiment, the subject matter of this example embodiment can optionally include that the silicon parameters comprise temperature and process information.

In another example embodiment, the subject matter of the first example embodiment can optionally include that the controller is a power management controller is operable to set a voltage for Low Temperature Effect Compensation (LTEC) based on based on silicon process monitor measurements. In another example embodiment, the subject matter of this example embodiment can optionally include that the power management controller is operable to update a table with information indicative of the voltage.

In a second example embodiment, a method comprises measuring silicon parameters of a semiconductor device using a process monitor on the semiconductor device and setting a voltage used on at least a portion of the semiconductor device based on silicon process monitor measurements.

In another example embodiment, the subject matter of the second example embodiment can optionally include that the voltage is a guardband voltage. In another example embodiment, the subject matter of this example embodiment can optionally include that the guardband is an aging related guardband.

In another example embodiment, the subject matter of the second example embodiment can optionally include that setting the voltage comprises setting one or more voltages for use in one or more steps of dynamic voltage and frequency scaling (DVFS) performed on the semiconductor device. In another example embodiment, the subject matter of this example embodiment can optionally include that the silicon parameters comprise temperature and process information.

In another example embodiment, the subject matter of the second example embodiment can optionally include that setting the voltage comprises setting a voltage for Low Temperature Effect Compensation (LTEC). In another example embodiment, the subject matter of this example embodiment can optionally include that the method further comprises updating a table with information indicative of the voltage.

In a third example embodiment, a machine-readable medium has instructions that when operated on by the machine cause the machine to perform operations comprising: requesting silicon parameters from a process monitor in a semiconductor device; and setting a voltage used on at least a portion of the semiconductor device based on silicon process monitor measurements.

In another example embodiment, the subject matter of the third example embodiment can optionally include the voltage is a guardband voltage.

In another example embodiment, the subject matter of the third example embodiment can optionally include that setting the voltage comprises setting one or more voltages for use in one or more steps of dynamic voltage and frequency scaling (DVFS) performed on the semiconductor device.

In another example embodiment, the subject matter of the third example embodiment can optionally include setting the voltage comprises setting a voltage for Low Temperature Effect Compensation (LTEC).

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A semiconductor device comprising:
   a process monitor chain to measure silicon parameters of the semiconductor device, the processes monitor chain having a plurality of process monitors;
   a first controller coupled to the process monitor chain to read data from the process monitor chain during a test mode;
   an agent to read data from the process monitor chain during a second mode different than the test mode;
   selection logic to provide the first controller and the agent access to the process monitor chain at different times and during different modes; and
   a second controller coupled to the process monitor to set a voltage for use on at least a portion of the semiconductor device based on silicon process monitor measurements read from the processor monitor by the agent.

2. The device defined in claim 1 wherein the first controller comprises
   a JTAG TAP controller; and
   wherein the selection logic is coupled to the JTAG TAP controller to provide the JTAG TAP controller and the agent access to the process monitor chain.

3. The device defined in claim 2 wherein the selection logic comprises a multiplexor.

4. The device defined in claim 1 wherein the voltage is a guardband voltage.

5. The device defined in claim 4 wherein the guardband is an aging related guardband voltage.

6. The device defined in claim 1 wherein the second controller is a power management controller to set one or more voltages for use in one or more steps of dynamic voltage and frequency scaling (DVFS) performed on the device based on based on silicon process monitor measurements.

7. The device defined in claim 6 wherein the silicon parameters comprise temperature and process information.

8. The device defined in claim 1 wherein the second controller is a power management controller is operable to set a voltage for Low Temperature Effect Compensation (LTEC) based on based on silicon process monitor measurements.

9. The device defined in 8 wherein the power management controller is operable to update a table with information indicative of the voltage.

10. A method comprising:
    measuring silicon parameters of a semiconductor device using a plurality of processor monitors in a process monitor chain on the semiconductor device, where the process monitor chain is read by a first controller during a test mode;

providing access to an agent to read the process monitor chain at a different time than the first controller and during a second mode different than the test mode;

reading, using an agent, data corresponding to silicon process monitor measurements from the process monitor chain during the second mode; and setting a voltage used on at least a portion of the semiconductor device based on the silicon process monitor measurements.

11. The method defined in claim 10 wherein the voltage is a guardband voltage.

12. The method defined in claim 11 wherein the guardband is an aging related guardband.

13. The method defined in claim 10 wherein setting the voltage comprises setting one or more voltages for use in one or more steps of dynamic voltage and frequency scaling (DVFS) performed on the semiconductor device.

14. The method defined in claim 13 wherein the silicon parameters comprise temperature and process information.

15. The method defined in claim 10 wherein setting the voltage comprises setting a voltage for Low Temperature Effect Compensation (LTEC).

16. The method defined in 15 further comprising updating a table with information indicative of the voltage.

17. A machine-readable medium having instructions that when operated on by the machine cause the machine to perform operations comprising:

requesting silicon parameters from a process monitor chain in a semiconductor device, wherein the processor monitor chain comprises a plurality of process monitors that are read by a first controller during a test mode;

providing access to an agent to read the process monitor chain at a different time than the first controller and during a second mode different than the test mode;

reading, using an agent, data corresponding to silicon process monitor measurements from the process monitor chain during the second mode; and setting a voltage used on at least a portion of the semiconductor device based on the silicon process monitor measurements.

18. The machine-readable medium defined in claim 17 wherein the voltage is a guardband voltage.

19. The machine-readable medium defined in claim 17 wherein setting the voltage comprises setting one or more voltages for use in one or more steps of dynamic voltage and frequency scaling (DVFS) performed on the semiconductor device.

20. The machine-readable medium defined in claim 17 wherein setting the voltage comprises setting a voltage for Low Temperature Effect Compensation (LTEC).

* * * * *